(12) United States Patent
Hsieh

(10) Patent No.: US 7,999,196 B2
(45) Date of Patent: Aug. 16, 2011

(54) SHIELDING ASSEMBLY

(75) Inventor: Hsing-Yuan Hsieh, Taipei Hsien (TW)

(73) Assignee: FIH (Hong Kong) Limited, Kowloon (HK)

( * ) Notice: Subject to any disclaimer, the term of this patent is extended or adjusted under 35 U.S.C. 154(b) by 90 days.

(21) Appl. No.: 12/260,882

(22) Filed: Oct. 29, 2008

(65) Prior Publication Data

US 2009/0283319 A1    Nov. 19, 2009

(30) Foreign Application Priority Data

May 19, 2008    (CN) .......................... 2008 1 0301629

(51) Int. Cl.
*H05K 9/00* (2006.01)
(52) U.S. Cl. ...................................... 174/386; 361/816
(58) Field of Classification Search .................. 174/350, 174/377, 386; 361/816, 818
See application file for complete search history.

(56) References Cited

U.S. PATENT DOCUMENTS

| | | | |
|---|---|---|---|
| 2004/0042176 A1* | 3/2004 | Niwatsukino et al. | 361/699 |
| 2005/0040535 A1* | 2/2005 | Kawata et al. | 257/765 |
| 2009/0242263 A1* | 10/2009 | Kapusta et al. | 174/350 |

* cited by examiner

*Primary Examiner* — Hung V Ngo
(74) *Attorney, Agent, or Firm* — Steven M. Reiss

(57) ABSTRACT

A shielding assembly (10) for electronic device is provided. The shielding assembly (10) comprises a plastic layer (12), a metal foil (16) mounted to the plastic layer (12), and a coolant (14) is formed between the plastic layer (12) and the metal foil (16). An electronic device using the shielding assembly is also provided.

11 Claims, 3 Drawing Sheets

SHIELDING ASSEMBLY

BACKGROUND

1. Field of the Invention

The exemplary invention relates to shielding assemblies and, particularly to shielding assemblies used for portable electronic devices.

2. Description of Related Art

The operation of portable electronic devices such as mobile telephone, televisions, radios, computers, medical instruments, business machines, communications equipment, and the like is attended by the generation of electromagnetic radiation within the electronic circuitry of the equipment, and is termed "electromagnetic interference" or "EMI" as being known to interfere with the operation of other proximate electronic devices.

To attenuate EMI effects, shielding can having the capability of absorbing and/or reflecting EMI energy may be employed to confine the EMI energy within a source device, and to insulate that device or other "target" devices from other source devices. Such shielding is provided as a barrier which is interposed between the source and the other devices, and typically is configured as an electrically conductive and grounded housing which encloses the device, or as a "can" which covers a discrete component or component of the device. The housing or can may be made of metal such as steel, aluminum, or magnesium, or alternatively, of plastic or other polymeric materials which is filled to be electrically-conductive. However, the typical shielding has not the function in the form of cooling the components.

Therefore, there is a room for improvement within the art.

BRIEF DESCRIPTION OF THE DRAWINGS

Many aspects of the exemplary shielding assembly can be better understood with reference to the following drawings. These drawings are not necessarily drawn to scale, the emphasis instead being placed upon clearly illustrating the principles of the exemplary shielding assembly. Moreover, in the drawings like reference numerals designate corresponding parts throughout the several views. Wherever possible, the same reference numbers are used throughout the drawings to refer to the same or like elements of an embodiment.

DETAILED DESCRIPTION OF THE EMBODIMENTS

Exemplary embodiments will now be described in detail below and with reference to the drawings. The shielding assembly is suitably assembled within the portable electronic device, such as the mobile phone, the personal digital handset, or the like.

Figure 1:
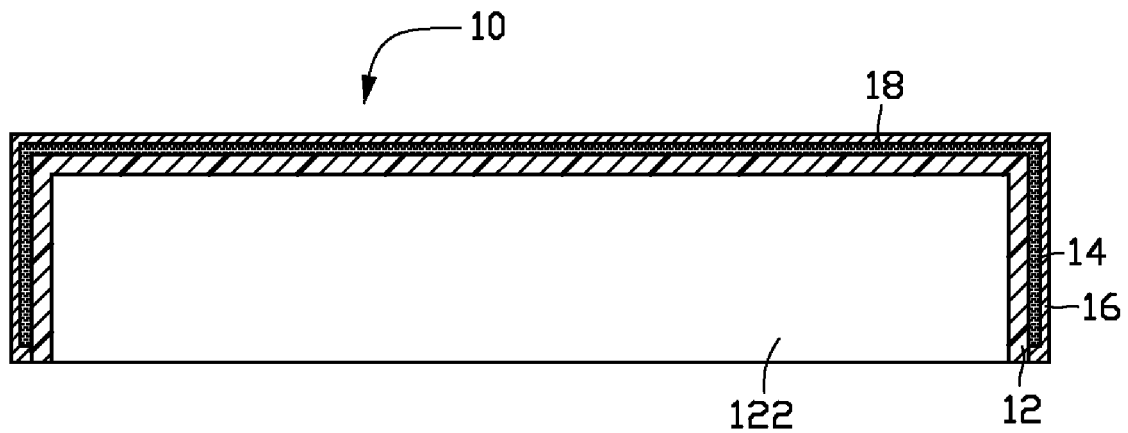
FIG. 1 is an assembled view of a shielding assembly according to an exemplary invention.
Figure 2:
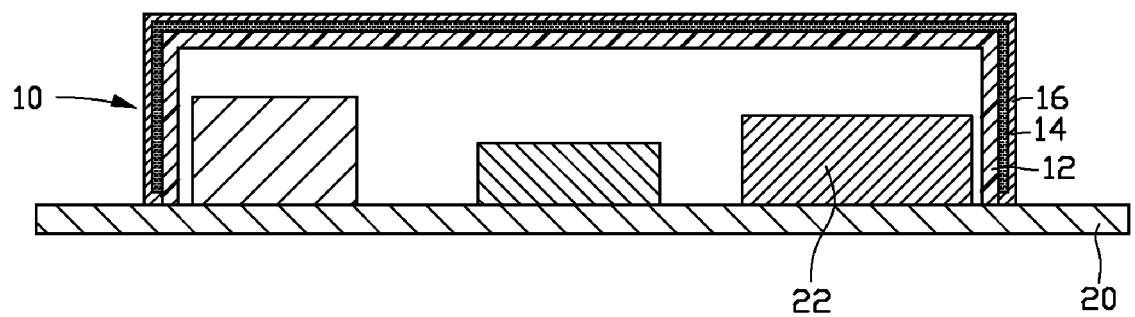
FIG. 2 is an illustration view of the shielding assembly in FIG. 1 assembled to a circuit board.

Referring to FIG. 1, the shielding assembly 10 includes a flexible plastic layer 12, a coolant 14, and a metal foil 16. Referring to FIG. 2, the plastic layer 12 encloses a room 122 for accommodating electronic components 22 on a circuit board 20. The metal foil 16 is mounted (e.g., adhered) to the plastic layer 12, and a chamber 18 is formed between the metal foil 16 and the plastic layer 12. The chamber 18 is for accommodating the coolant 14.

The plastic layer 12 may be made of one or more materials selected from a group consisting of polyvinyl chloride (PVC), polycarbonate, polystyrene, and any other thermoplastic resins. The metal foil 16 is made of metal material, such as iron or aluminum.

The coolant 14 may be made of one or more non-conductive materials selected from a group consisting of wax, olefin, water and so on. The coolant 14 is used to dissipate heat generated by the electronic components 22.

Figure 3:
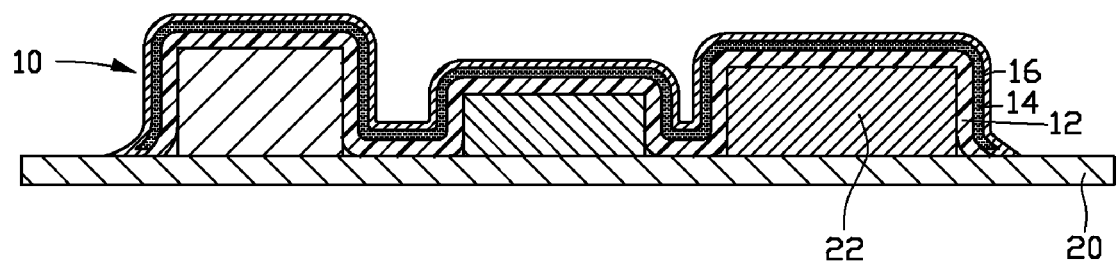
FIG. 3 is an illustration view of the shielding assembly in FIG. 2, when the shielding assembly is treated by vacuum-pumping.

Referring to FIGS. 2 and 3, the shielding assembly 10 is mounted to the circuit board 20, during this stage, the electronic components 22 is accommodated in the room 122 and the metal foil 16 is grounded. After that, the room 122 is treated by a vacuum-pumping process to attach the shielding assembly 10 to the electronic components 22, i.e., finishing assembling the shielding assembly 10 with the circuit board 20.

An advantage of the exemplary embodiment is as follows. The chamber 18 is formed between the metal foil 16 and the plastic layer 12, and the chamber 18 accommodates the coolant 14 therein, so temperature within the room 122 may be reduced by the coolant 14.

Another advantage of the exemplary embodiment is as follows. When the shielding assembly 10 is mounted to the circuit board 20, the room 122 is treated by the vacuum-pumping process so the shielding assembly 10 is tightly attached to the electronic components 22, as a result, decreasing the amount of space for placing the shielding assembly 10.

It is to be understood, the plastic layer 12 may be made of hard material, in this manner, when the room 122 is treat by vacuum-pumping process, firstly heats the plastic layer 12 to soften.

It is to be understood, however, that even through numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A shielding assembly for electronic device, comprising:
   a plastic layer;
   a metal foil mounted to the plastic layer and forming an EMI shield; and
   a coolant being made non-conductive material selected from a group consisting of wax, olefin, and water, the coolant separated from the plastic layer and the metal foil and formed between the plastic layer and the metal foil.

2. The shielding assembly as claimed in claim 1, wherein a chamber is formed between the plastic layer and a metal foil, the coolant is accommodated in the chamber.

3. The shielding assembly as claimed in claim 1, wherein the plastic layer is made of one or more materials selected from a group consisting of polyvinyl chloride (PVC), polycarbonate, and polystyrene.

4. The shielding assembly as claimed in claim 1, wherein the metal material is iron or aluminum.

5. The shielding assembly as claimed in claim 1, wherein the metal foil is adhered to the plastic layer.

6. The shielding assembly as claimed in claim 1, wherein the plastic layer is flexible.

7. The shielding assembly as claimed in claim 1, wherein the plastic layer is hard.

8. An electronic device, comprising:
a shielding assembly including:
a plastic layer enclosing a room;
a metal foil mounted to the plastic layer; and
a coolant being formed between the plastic layer and the metal foil, the coolant being made of one or more non-conductive materials selected from a group consisting of wax, olefin, and water;
an circuit board having electronic components disposed thereon and ground formed thereon;
wherein the electronic components is accommodated in the room and the metal foil is connected with the grounds of the circuit board.

9. The electronic device as claimed in claim 8, wherein the room is treated by vacuum-pumping process, such that the plastic layer of the shielding assembly is attached to the electronic components.

10. The electronic device as claimed in claim 8, wherein a chamber is formed between the plastic layer and a metal foil, the coolant is accommodated in the chamber.

11. The electronic device as claimed in claim 8, wherein the plastic layer is made of one or more materials selected from a group consisting of polyvinyl chloride (PVC), polycarbonate, and polystyrene.

* * * * *